(12) United States Patent
Patel et al.

(10) Patent No.: US 7,134,289 B2
(45) Date of Patent: Nov. 14, 2006

(54) MULTI-STATE SPRAY COOLING SYSTEM

(75) Inventors: Chandrakant D. Patel, Fremont, CA (US); Cullen E. Bash, San Francisco, CA (US); Ratnesh Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/005,283

(22) Filed: Dec. 4, 2004

(65) Prior Publication Data

US 2006/0117764 A1 Jun. 8, 2006

(51) Int. Cl.
*F28C 1/00* (2006.01)
(52) U.S. Cl. .............................. 62/121; 62/64
(58) Field of Classification Search ............... 62/259.2, 62/121, 64, 74; 165/80.4, 104.33; 361/699
See application file for complete search history.

(56) References Cited

U.S. PATENT DOCUMENTS

| | | | |
|---|---|---|---|
| 4,897,762 A * | 1/1990 | Daikoku et al. ............ 361/689 |
| 6,205,799 B1 | 3/2001 | Bash et al. | |
| 6,349,554 B1 | 2/2002 | Patel et al. | |
| 6,457,321 B1 | 10/2002 | Patel et al. | |
| 6,484,521 B1 | 11/2002 | Patel et al. | |
| 6,550,263 B1 | 4/2003 | Patel et al. | |
| 6,595,014 B1 | 7/2003 | Malone et al. | |
| 6,604,370 B1 | 8/2003 | Bash et al. | |
| 6,612,120 B1 | 9/2003 | Patel et al. | |
| 6,644,058 B1 | 11/2003 | Bash et al. | |
| 6,646,879 B1 * | 11/2003 | Pautsch ..................... 361/699 |
| 6,708,515 B1 | 3/2004 | Malone et al. | |
| 6,817,196 B1 | 11/2004 | Malone et al. | |
| 6,817,204 B1 | 11/2004 | Bash et al. | |

* cited by examiner

*Primary Examiner*—Melvin Jones
(74) *Attorney, Agent, or Firm*—Richard P. Lange

(57) ABSTRACT

A cooling system including a thermosyphon subsystem and a spray cooling subsystem, each being configured to evaporatively cool a component, and a controller configured to selectively operate the spray cooling subsystem based on the cooling requirements of the component. The controller controls a valve limiting the operation of the thermosyphon when the spray cooling system is active. The component is configured to run in a plurality of performance states including a low power state and a high power state. The spray cooling system operates when the component is in the high power state. The controller can order the component to operate in a lower power state if the cooling systems are inadequate to the cooling needs. The cooling needs are determined with a component temperature sensor, a vapor temperature sensor, a vapor pressure sensor, or a power usage sensor.

28 Claims, 2 Drawing Sheets

MULTI-STATE SPRAY COOLING SYSTEM

The present invention relates generally to cooling systems for heat-generating components and, more particularly, to a spray cooling system having multiple cooling states, and methods of using the spray cooling system to cool one or more semiconductor devices (i.e., chips).

BACKGROUND OF THE INVENTION

With the advent of semiconductor devices having increasingly large component densities, the removal of heat generated by the devices has become an increasingly challenging technical issue. Over time, the frequency of operation of CMOS devices has increased significantly. The resulting microprocessor power dissipation has likewise gone up by an order of magnitude. While the input voltage and capacitance of devices have decreased, the number of devices on a typical microprocessor die continues to increase rapidly as processing efficiency is sought. Moreover, device miniaturization has led device designers to integrate previously separate components, such as those used to create a cache, into the microprocessor die.

This consolidation of devices has resulted in high CPU core power density, e.g., 50% of a 20 mm by 20 mm microprocessor die may contain the CPU core, with the rest being cache. Furthermore, typical processor boards can, in some instances, include multiple CPU modules, application-specific integrated circuits (ICs), and static random access memory (SRAM), as well as a dc-dc converter, all of which have increasing power dissipation requirements, thereby increasing the total power dissipation level needed by computer systems.

Heat sinks can be used to increase the heat-dissipating surface area of heat-producing devices. However, heat sinks are typically characterized by a mechanical interface to their cooled devices, which commonly leads to interference in the heat flow, and can lead to very high thermal resistance. Indeed, the bulk of the available thermal budget for cooling, typically a 45 degrees C. temperature differential between the chip temperature and the ambient temperature, will commonly be used up by this interface. The mechanical interface can also lead to uneven cooling. This is further complicated by the non-uniform power distribution on many chips, which often results when different components are integrated onto a single chip.

To deal with these difficulties, innovative ways have been developed to reduce chip-to-heat sink thermal resistance. Included among the cooling methods for semiconductors are free-flowing and forced-air convection, free-flowing and forced-liquid convection, pool boiling (i.e., boiling a liquid cooling fluid off a submerged device), and spray cooling (i.e., boiling a liquid cooling fluid off a device being sprayed with the liquid). Because liquids typically have a high latent heat of vaporization, these latter two methods provide for a high heat-transfer efficiency, absorbing a large quantity of heat at a constant temperature.

The use of these boiling/vaporizing methods is limited to a maximum power density, the critical heat flux (CHF). At higher densities, the vaporized cooling fluid forms a vapor barrier insulating the device from the liquid cooling fluid, thus allowing the wall temperature of the device to increase greatly. This phenomenon is referred to as dry-out. When a coolant is properly sprayed, it can disperse such a vapor layer, and its CHF can be well over an order of magnitude higher than the CHF of a pool-boiling system. This high CHF is preferably a uniform spray, and should match the power dissipation requirements of the device. Thus, spray cooling presently provides the most efficient cooling for a heat-generating device, such as a semiconductor device.

Typically, the cooling fluid used for spray cooling has a relatively low boiling point (in relation to the operating temperature of the device), which is the temperature that the sprayed device is cooled toward. Most preferably, the cooling fluid is inert to the heat source. For semiconductor devices, low boiling point fluids such as 3M® FC-72, (FC-72, i.e., FLUORINERT®, sold by 3M® Corporation), 3M's Novec line of fluids (HFE 7100, etc., sold by 3M® Corporation) or PF-5060 are among a number of known suitable cooling liquids. Water may also be preferable in some instances.

The nozzle design is a key component of spray cooling. Pressure assisted and gas assisted nozzles are known designs where the cooling fluid is continuously sprayed. However, these types of nozzles are limited in their ability to control the rate at which they spray. Therefore, they can cause "pooling" (i.e., a buildup of liquid on the cooled device due to excessive spray rates).

For pressure-assisted spraying, consistent, controlled spraying requires one or more high pressure pumps that provide a precise pressure to pump the liquid through a nozzle, even at varying flow rates. Both the distribution and the flow rate of the sprayed liquid can change with variations in the driving pressure and/or small variations in the nozzle construction. Thus, the cooling system is a sensitive and potentially expensive device that can be a challenge to control.

For gas atomizing, consistent, controlled spraying requires a pressurized gas that is delivered to a spray head design in a precise fashion. Because the gas must be pressurized separately from the cooling fluid, such systems are not typically closed systems. The gas must be bled out for the condenser to run efficiently. Furthermore, both the distribution and the flow rate of the cooling fluid can change with variations in the gas pressure. Thus, the cooling system is a sensitive and potentially expensive device that can be a challenge to control.

Piezoelectric and thermal spray-jet nozzles are known designs where the cooling fluid is incrementally sprayed (i.e., it is sprayed in increments on demand). While these types of nozzles typically provide superior control over the spray flow rate, it is possible that they might experience flow difficulties relating to their incremental spray mechanisms. Piezoelectric nozzles eject droplets of liquid from a chamber due to a pressure wave within the chamber. The pressure wave is cased by the contraction of the chamber from an electrical charge applied to a piezoelectric device. Thermal spray-jet nozzles use heaters to vaporize a small portion of a fluid in a chamber. The vaporized fluid expands, causing the remainder of the fluid to be ejected from the chamber.

A number of factors affect the performance of spray cooling, thus affecting the heat transfer coefficient h and/or the CHF. It is commonly understood that surface roughness and wettability of the sprayed component are two of these factors, and the orientation of the surface being sprayed can be a third. In particular, it is believed that h is higher for rough surfaces when using a pressurized liquid spray, and for smooth surfaces when using gas atomizing. Surfaces with decreased wettability appear to have a marginal increase in h.

Critical to consistent, controlled cooling is the controlled application of the liquid cooling fluid in a desired distribution, flow rate, and velocity. For example, at a low mass flow rate, CHF and h increase with the mass flow rate. However, at a critical mass flow rate, the advantages of increased mass flow are diminished due to pooling and/or due to a transition to single phase heat transfer. Thus, a spray cooling system is preferably operated uniformly at a mass flow rate defined at a point before the critical mass flow rate is reached. All of these factors make critical the design of the sprayer, i.e., the design of the nozzle and its related spray devices.

Also important to the cooling system design is its operating temperature. In particular, it is desirable to configure the system to operate at a high h, which will occur with a design temperature above the boiling temperature and below a temperature that will dry out the sprayed coolant. The amount of heat to be dissipated must be less than the CHF.

While spray cooling can provide excellent heat flux, spray cooling systems may have their difficulties. Among these difficulties is the fact that spray cooling heads are finely tuned devices that can degenerate over a period of extensive use. As a result, spray cooling systems might not have the life span that would otherwise be desired from a cooling system. Also, the power requirements of spray cooling systems may be excessive when used to cool components that only occasionally need the high-heat-flux capabilities of spray cooling.

Accordingly, there has existed a need for a small, accurate, reliable and cost-efficient spray cooling system that can be used to support complex processing systems having one or more high-dissipation devices. The spray cooling system will preferably offer efficient power usage and an effective life span from the standpoint of a computer system operator. Preferred embodiments of the present invention satisfy these and other needs, and provide further related advantages.

SUMMARY OF THE INVENTION

In various preferred embodiments, the present invention solves some or all of the needs mentioned above by providing a package-level cooling system that efficiently operates to provide accurate cooling to a component over a significant life span.

The system for evaporatively cooling a component, such as a semiconductor device with a cooling fluid, of the invention, features a first cooling subsystem configured to cool the component, and a second cooling subsystem configured to evaporatively cool the component. The second cooling subsystem is separately operable from the first cooling subsystem. The system further features a controller configured to selectively operate the second cooling subsystem based on the cooling requirements of the component, and may also be further configured control the performance state of the component based upon the functionality of the first and/or second cooling systems.

The system further features that the controller is configured to receive information indicating a dry-out condition on the component, and to operate the second cooling subsystem based on the received information.

Other features and advantages of the invention will become apparent from the following detailed description of the preferred embodiments, taken in conjunction with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read in conjunction with the accompanying drawings. This detailed description of particular preferred embodiments of the invention, set out below to enable one to build and use particular implementations of the invention, is not intended to limit the enumerated claims, but rather it is intended to provide particular examples thereof.

Evaporative spray cooling promises to be a technology that can deliver high performance cooling. An objective of spray cooling is for a device's wall-temperature to achieve a value close to a coolant's saturation temperature.

Figure 1:
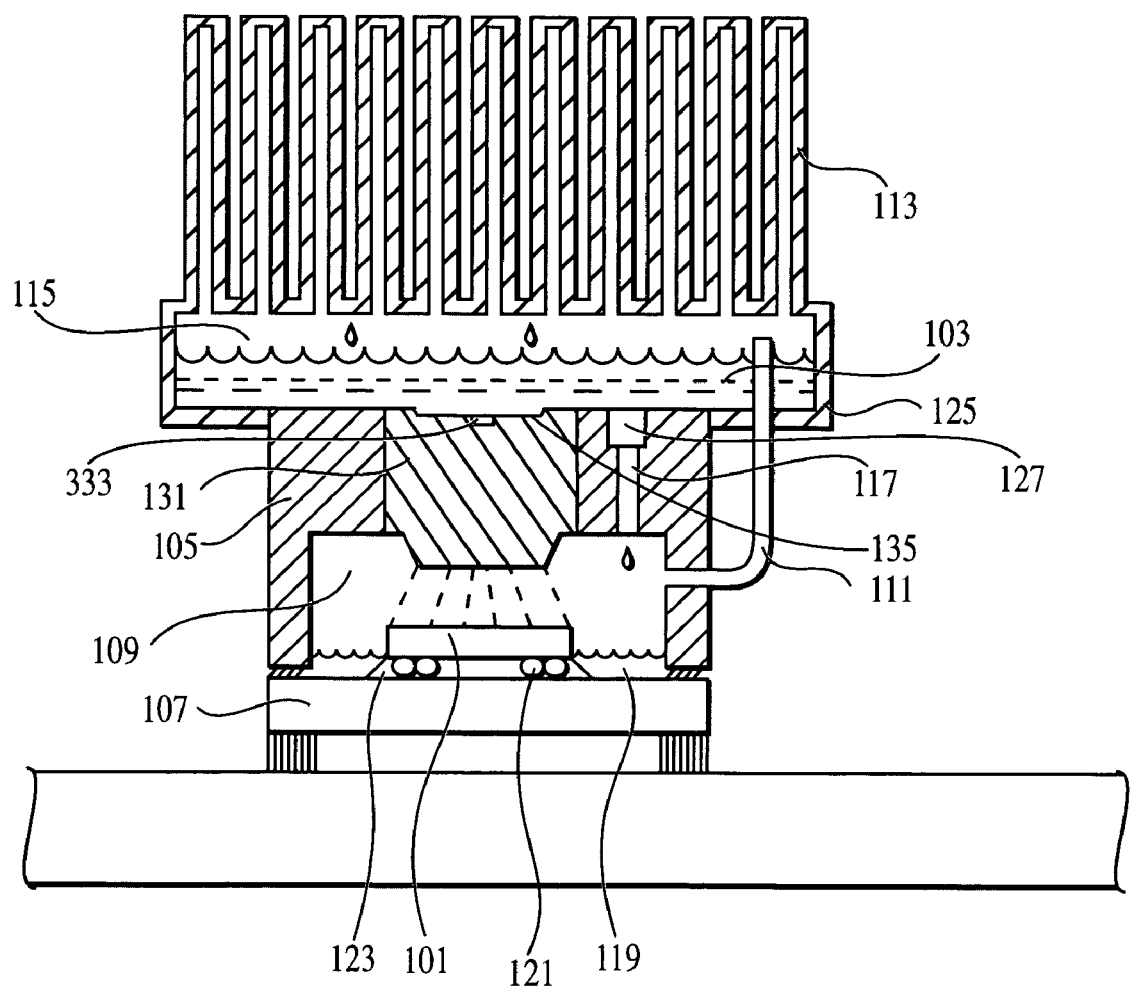
FIG. 1 is a cross-sectional view of a first cooling system embodying the invention.

With reference to FIG. 1, a first embodiment of a cooling system is for cooling a component 101, such as a heat-generating semiconductor device, other information processing device, optical component, or the like.

The cooling system cools the component 101 with a cooling fluid 103, which may be water (e.g., at reduced pressure), or another fluid having appropriate characteristics for spray cooling. The cooling system is incorporated into a cooling cap 105, which is affixed to a substrate 107 mounting the component 101. The cooling cap may be removably affixed to the substrate, providing for both the cooling cap to be a modular part, and the component to be serviceable. The cooling system forms a closed loop system in the cooling cap when the cooling cap is affixed to the substrate. The cooling system includes a first cooling subsystem configured to cool the component, a second cooling subsystem configured to evaporatively cool the component, and a controller. The controller may be incorporated in the component (as depicted), or may be in a separate piece of hardware. The controller may be mechanical, electrical, software, or in another such control system form The first cooling subsystem preferably operates passively (i.e., without active mechanical or electrical parts), such as in the form of a thermosyphon. To this end, the cooling cap includes a cavity defining an evaporation chamber 109, when affixed to the substrate 107, a vapor escape passage 111, a condenser 113, a reservoir 115 and a cooling fluid return tube 117. The component 101 is contained within the evaporation chamber 109, into which cooling fluid pours from the cooling fluid return tube 117. Cooling fluid within the evaporation chamber forms a cooling pool 119 around the component. Preferably, the cooling fluid does not conduct electricity. Additionally, leads 121 from the component are preferably hermetically sealed by a sealant 123 to avoid contact with the cooling fluid. Similarly, exposed electrically conductive surfaces on the component may be sealed.

The cooling pool 119 cools the component 101, and heat absorbed from the component evaporates cooling fluid from the cooling pool. Vapor pressure drives the evaporated cooling fluid to pass from the evaporation chamber 109, through the vapor escape passage 111, and into the condenser 113. If the condenser and reservoir are coextensive, then preferably the vapor escape passage releases the vapor into the condenser at a level that is gravitationally above the level to which condensed cooling fluid may rise in the reservoir. Alternatively, the system may be designed such that a sufficiently high pressure in the condenser, with respect to the pressure within the reservoir, will force fluid to flow from the condenser to the reservoir.

The condenser may operate by any of a number of different cooling schemes, including air cooling and liquid loop cooling, as is known for condensers. The condenser cools the cooling fluid vapor received from the evaporation chamber, and the resulting cooling fluid condensate drips into the reservoir 115. Preferably, the condenser and reservoir form a single, coextensive, liquid-supply chamber 125.

Condensed cooling fluid 103 within the liquid-supply chamber 125 is drawn by gravity through the cooling fluid return tube 117 to return to the cooling pool 119. Optionally, the cooling fluid return tube may be configured with a taper from a larger opening at the top to a smaller opening at the bottom. This taper may help to prevent vapor backflow during low liquid downflow conditions by ensuring that the downflow fills the full bore of the return tube.

The first cooling subsystem thus defines a first-subsystem, closed pathway in which the cooling fluid circulates to evaporatively cool the component. The heat flux with which the first cooling subsystem operates depends on the heat radiated by the component. Thus, within the first cooling subsystem's range of heat dissipation, its heat flux is self adjusting.

The first cooling subsystem may be configured to operate continuously (without being controlled by the controller), or may include a control mechanism configured to control operation of the first cooling subsystem. If the first cooling subsystem is configured to operate under the control of the controller, then preferably the controller is configured to selectively operate the first cooling subsystem based on the cooling requirements of the component, and optionally on information regarding the functionality of the second cooling subsystem. To control the first cooling subsystem, preferably the control mechanism is a valve 127 that can variably control and/or block the passage of fluid through the cooling fluid return tube 117, and thereby limit the operation of the thermosyphon. At the same time the valve blocks the passage of fluid through the cooling fluid return tube, it also blocks vapor from backflowing through the return tube. Optionally, the valve may also operate to retain cooling fluid within the reservoir prior to the cooling cap 105 being affixed to the substrate 107, or after the cooling cap has been removed from the substrate.

The second cooling subsystem is separately operable from the first cooling subsystem, and the controller is configured to selectively operate the second cooling subsystem based on the cooling requirements of the component. The second cooling subsystem defines a second-subsystem closed pathway in which cooling fluid circulates to evaporatively cool the component. The first-subsystem pathway and the second-subsystem pathway are at least partially distinct. More particularly, while the first-subsystem pathway includes the cooling fluid return tube 117, the second-subsystem pathway includes a spray cooling system 131 that sprays cooling fluid from the reservoir 115 onto the component. The spray cooling system may be any of a variety of systems, such as incremental spray systems (e.g., a thermal spray jet or piezoelectric sprayer), or continuous spray systems.

Preferably, the second cooling subsystem is configured to cool the component 101 at a heat flux substantially greater than the heat flux with which the first cooling subsystem is capable of cooling the component. The second cooling subsystem spray-cools the component to achieve this greater level of heat flux. The controller is preferably configured to control the flux of coolant sprayed by the spray cooling system in response to the cooling needs of the component. Thus, within the second cooling subsystem's range of heat dissipation, its heat flux is adjusted by the controller.

Communication between the control mechanisms of the first and second cooling subsystems (i.e., the valve 127 and the spray cooling system 131) and the controller may pass between the substrate 107 and the cooling cap 105, or external connection means may be provided.

The cooling system can transition between various cooling states for cooling the component by using various combinations of the first cooling subsystem and/or the second cooling subsystem, and by optionally using multiple cooling levels from one, the other or both cooling subsystems. The controller can select between the various cooling states available for cooling by using one or more of a number of monitoring systems.

In a first monitoring system, a dry-out condition (i.e., a condition wherein a substantial enough portion of the cooling pool has evaporated such that the cooling pool cannot adequately cool the component) is detected by monitoring component temperature via an on-component sensor. Such a sensor might be a diode or temperature sensitive resistor.

Information from the sensor is received by the controller (e.g., by reading the information or requesting that it be transmitted). When the received information indicates that the sensor detects a significant increase in temperature within a given time, or detects a temperature above a predetermined maximum, or other such criteria, a condition of dry-out is indicated. Optionally, any available information regarding power usage (e.g., p-state information) may be correlated with the sensor information to aid in accurate assessment. Experimental data or analysis may be used to establish the criteria for an indication of dry-out, such as variables established at a start-up or configuration phase for a given product.

If a condition of dry-out is detected and the second cooling subsystem is not active, then the controller sends one or more control signals to activate and operate the second cooling subsystem, preferably through one of a plurality of spray flux rates, as needed. Optionally, if dry-out is detected and the second cooling subsystem is already instructed to be active at its maximum flux rate, and if the first cooling subsystem has been instructed to be inactive, then the controller may send instructions to activate the first cooling subsystem. If dry-out is detected and both the first and second cooling subsystems are active (or if the first cooling subsystem is not to be activated at the same time as the second), then the component is signaled to reduce its performance state, e.g., power level, until a condition of dry-out is no longer detected.

In a second monitoring system, a dry-out condition is detected by monitoring the vapor temperature, such as within the evaporation chamber, via a temperature sensor. Information from the sensor is received by the controller. When the received information indicates that the sensor detects a significant increase in temperature, a condition of dry-out is indicated.

In a third monitoring system, a dry-out condition is detected by monitoring the vapor pressure in the evaporation chamber via a pressure sensor. Information from the sensor is received by the controller. When the received information indicates that the sensor detects a significant deviation from a normal set point, a condition of dry-out is indicated.

In a fourth monitoring system, a dry-out condition is detected by monitoring the performance state, e.g., power usage, of the component. This information may be monitored by a performance state monitor, e.g., a monitor that monitors the power draw of the component, or that is a part of the component itself and monitors an operating level of the component. The performance state monitor typically reports information to the controller either as a power usage level or an operating state (e.g., p-state) indication. When the received information indicates that the performance state is at an established high level, a condition of dry-out is indicated.

Regarding this last point, preferably, the component is configured to run in a plurality of performance states including a low-heat-flux state and a high-heat-flux state, e.g., a low power state and a high power state, respectively. It should be understood that for different types of components, the performance states may represent different conditions characterized by different heat-flux requirements. The first cooling subsystem operates to cool the component while the component is operating in the low-heat-flux state. Preferably, the controller controls the second cooling subsystem such that it does not operate while the component is operating in the low-heat-flux state, thereby reducing cooling system power usage and extending the life span of the second cooling subsystem.

Optionally, monitoring systems may also be used to determine cooling regime detection to provide accurate information on required spray coolant flux during spray cooling. Some monitoring systems appropriate for use in this invention are disclosed in U.S. Pat. No. 6,205,709, issued Mar. 27, 2001; U.S. Pat. No. 6,484,521, issued Nov. 26, 2002; and U.S. Pat. No. 6,595,014, Jul. 22, 2003, all of which are incorporated herein by reference for all purposes.

The controller is configured to operate the second cooling subsystem when the component is operating in the high-heat-flux state. The first cooling subsystem might also operate to cool the component while the component is operating in the high-heat-flux state. Alternatively, the controller may actively control the first cooling subsystem such that it does not operate while the component is operating in the high-heat-flux state. In a second alternative, the two cooling subsystems may be configured such that the first cooling subsystem is passively limited in operation, or passively prevented from operation, by the operation of this second cooling subsystem. For example, the first cooling subsystem could include an inlet 133 in a recessed portion 135 of the reservoir 115. The total quantity of cooling fluid may then be set such that operation of the second cooling subsystem would lower the level of cooling fluid within the reservoir to a level wherein a significant quantity of cooling fluid would not flow down through the cooling fluid return tube 117. It may be preferable either to close the valve 127 or keep the fluid return tube operating, so as to avoid vapor from entering the fluid return tube.

Optionally, the controller may be configured to control the performance state of the component. This option may be used to control the performance state of the component based upon the functionality of the first and/or second cooling subsystems, e.g., based upon whether the spray cooling system is operational, or is likely to fail soon. For example, with thermal spray jet sprayers, functionality information on the degradation of the thermal resistor that fires each sprayer might be obtained by measuring the resistance of the resistor, or by sensing its temperature.

Likewise, the controller may be configured to control the performance state of the component based upon parameters regarding conditions external (e.g., received from sources external) to the component and cooling system. For example, the controller may be configured to respond to the type of power source (e.g., a battery, or a continuous power source), the priority of processing to be done by the component, the time at which or within which processing needs to be done, the time through which a battery charge must last, or even the direct input of a user.

Optionally, the cooling system may include a level sensor in the reservoir. The level sensor may provide information regarding the possability that the cooling system will run low on cooling fluid. This situation might occur when the condenser is operating at an inadequate rate, or when cooling fluid has leaked from the system.

In response to sensing a low cooling-fluid level, the condenser for firmly can be made to operate at a higher rate. For example, a fan on the condenser may increase convective cooling of the condenser, or a pump could increase the flow rate of liquid passing through a liquid-cooled condenser. Also, the controller could instruct the component to operate in the lower performance state until the liquid level increases within the reservoir.

A variety of different level sensor types may be used for the level sensor. For example, calibrated capacitor plates may be provided in the walls of the reservoir. Alternatively, a pressure sensor (e.g., appease electric pressure sensor) might be embedded in a bottom edge of the reservoir.

Figure 2:
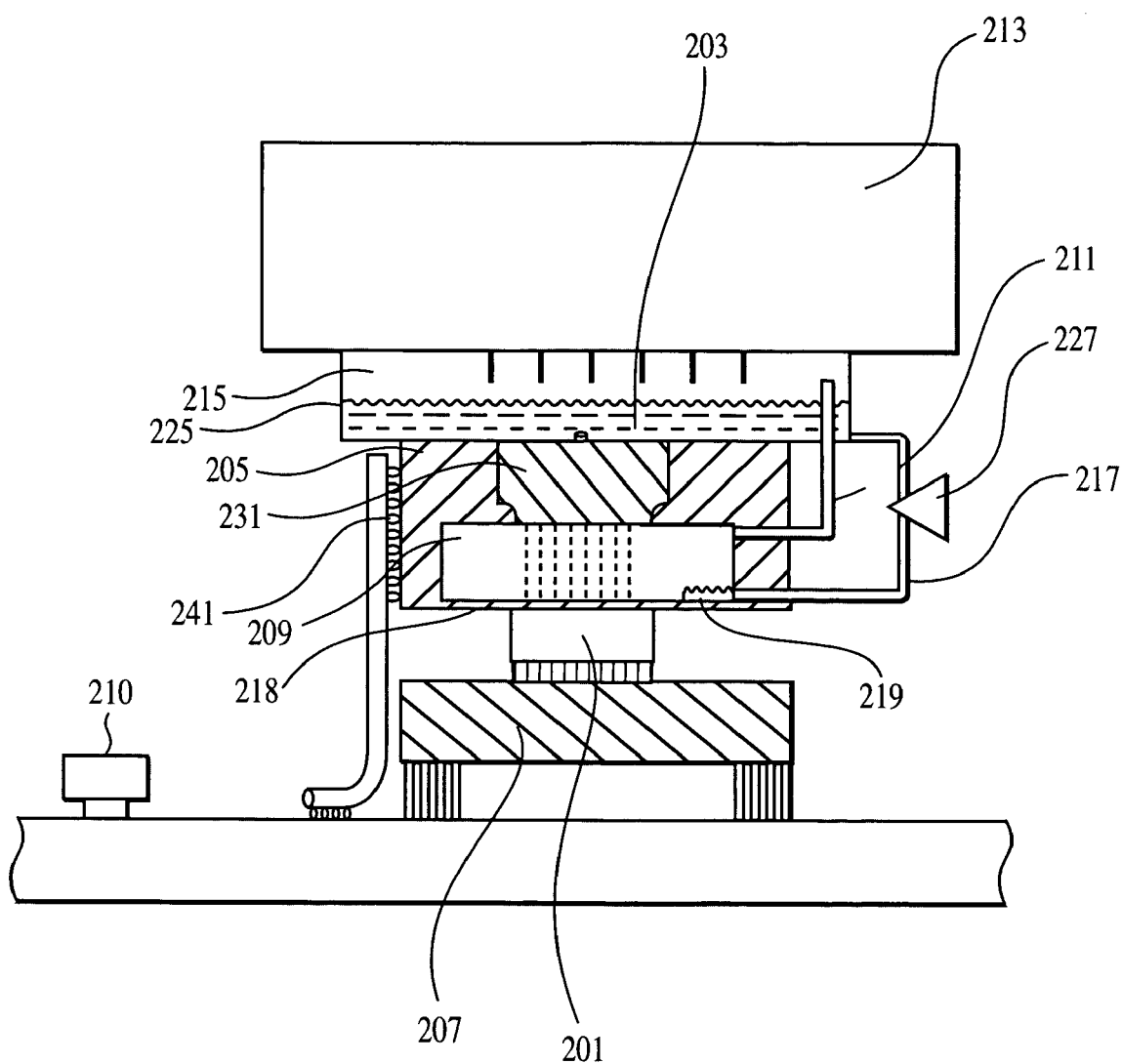
FIG. 2 is a cross-sectional view of a second cooling system embodying the invention.

With reference to FIG. 2, a second embodiment of a cooling system is also for cooling a component 201, such as a heat-generating semiconductor device, other information processing device, optical component, or the like. Operationally, this device is similar to the first embodiment, including monitoring systems and other features described above, except as otherwise indicated below.

The cooling system cools the component 201 with a cooling fluid 203, which may be water, or another fluid having appropriate characteristics. The cooling system is incorporated into a cooling cap 205. Unlike the first embodiment, the cooling cap is adjoined and/or affixed to the component, such as by an adhesive or a compressive actuator. The component is mounted on a substrate 207. Similar to the first embodiment, the cooling system includes a first cooling subsystem configured to cool the component, a second cooling subsystem configured to evaporatively cool the component, and a controller 210. The controller could be incorporated in the component (as in the first embodiment), or may be in a separate piece of hardware (as depicted).

As described above, the first cooling subsystem preferably operates passively, such as in the form of a thermosyphon. To this end, the cap includes a cavity defining an evaporation chamber 209, a vapor escape passage 211, a condenser 213, a reservoir 215 and a cooling fluid return tube 217. The evaporation chamber is enclosed with a transfer wall 218, such that the cooling fluid of the cooling system is wholly enclosed by the cooling cap (i.e., the cooling system is a closed loop system), while the component 201 is external to the cooling cap. Heat is transferred from the component to the evaporation chamber through the transfer wall. Cooling fluid within the evaporation chamber forms a cooling pool 219 in thermal contact with the component. In this embodiment, the cooling fluid may optionally conduct electricity without the need for sealing the component.

The cooling pool 219 cools the component 201 through the transfer wall 218, and heat absorbed from the component evaporates cooling fluid from the cooling pool. Vapor pressure drives the evaporated cooling fluid to pass from the evaporation chamber 209, through the vapor escape passage 211, and to the condenser 213. If the condenser and reservoir are coextensive, then preferably the vapor escape passage releases the vapor into the condenser at a level that is gravitationally above the level to which condensed cooling fluid may rise in the reservoir. As before, the condenser may operate by any of a number of different cooling schemes, including air cooling and liquid loop cooling, as is known for condensers. The condenser cools the cooling fluid vapor received from the evaporation chamber, and the resulting condensate drips into a pool in the reservoir 215. Preferably, the condenser and reservoir form a single, coextensive liquid-supply chamber 225.

Condensed cooling fluid 203 within the liquid-supply chamber 225 is drawn by gravity through the cooling fluid return tube 217, which is external to the cooling cap, to return to the cooling pool 219. The first cooling subsystem thus defines a first-subsystem closed pathway in which the cooling fluid circulates to evaporatively cool the component.

The first cooling subsystem may be configured to operate continuously (without being controlled by the controller), or may include a control mechanism configured to control operation of the first cooling subsystem. If the first cooling subsystem is configured to operate under the control of the controller, then preferably the controller is configured to selectively operate the first cooling subsystem based on the cooling requirements of the component, and optionally on information regarding the functionality of the second cooling subsystem. To control the first cooling subsystem, preferably the control mechanism is a valve 227 that can variably control and/or block the passage of fluid through the cooling fluid return tube 217, and thereby limit the operation of the thermosyphon.

The second cooling subsystem is separately operable from the first cooling subsystem, and the controller is configured to selectively operate the second cooling subsystem based on the cooling requirements of the component. The second cooling subsystem defines a second-subsystem closed pathway in which cooling fluid circulates to evaporatively cool the component. The first-subsystem pathway and the second-subsystem pathway are at least partially distinct. More particularly, while the first-subsystem pathway includes the cooling fluid return tube 217, the second-subsystem pathway includes a spray cooling system 231 that sprays cooling fluid from the reservoir 215 on the transfer wall, in thermal contact with the component.

Preferably, the second cooling subsystem is configured to cool the component 201 at a heat flux substantially greater than the heat flux with which the first cooling subsystem is capable of cooling the component. The second cooling subsystem spray-cools the component to achieve this greater level of heat flux. The controller is preferably configured to control the flux of coolant sprayed by the spray cooling system in response to the cooling needs of the component, as identified by one or more monitoring systems similar to ones described for the first embodiment.

Communication between the control mechanisms of the first and second cooling subsystems (i.e., the valve 227 and the spray cooling system 231) and the controller 210 may travel through a variety of pathways, such as via an electrical connector 241 connecting the cooling cap to a printed circuit board upon which the controller is mounted.

The above-described embodiments have been discussed with regard to a component characterized by a single variable, e.g., a performance state variable or a temperature variable. It is to be understood that the invention is also applicable to components characterized by multiple variables, e.g., multiple performance state and/or temperature variables. For example, a single component might contain a different CPU or cache in each of several thermally distinct portions of the component, each having its own performance state. Such components may be handled by several different temperature management systems.

In a first temperature management system, the performance state of each thermally distinct portion of the component is monitored, such as by a temperature sensor or a performance state monitor. When the state of any one or more portions of the component exceed a predetermined level or increase rapidly, the entire component is treated as in a high-heat-flux state. More particularly, the spray cooling system is activated, and optionally the thermosyphon valve is closed to prevent the thermosyphon from operating.

In a second temperature management system, the performance state at each thermally distinct portion of the component is monitored, such as by a temperature sensor or a performance state monitor. When the state of any one or more portions of the component exceed a predetermined level or increase rapidly, those portions are treated as in high-heat-flux states. More particularly, the spray cooling system is activated to spray on the portions that have dried-out because they are in the high-heat-flux states. The thermosyphon continues to operate, providing a pool of cooling fluid over the portions that are not in a high-heat-flux state. In this temperature management system, if a given thermally distinct portion that is in a low-heat-flux state is surrounded by portions that are in high-heat-flux states, then it should be assumed that the pool of cooling fluid will not reach the surrounded portion, and spray cooling should be used.

While the invention has been described as incorporated in a cooling cap, it is to be understood that the condenser and reservoir may be separately located. A spray cooling system of this sort is discussed in U.S. Pat. No. 6,550,263, issued Apr. 22, 2003, which is incorporated herein by reference for all purposes.

It is to be understood that the invention comprises apparatus and methods for designing cooling systems and for producing cooling systems, and also the apparatus and methods of the cooling system itself. Additionally, the various embodiments of the invention can incorporate various combinations of the features disclosed above in generally discussing a spray cooling system, and can be designed, made and operated using related methods (or portions thereof) as described above for the spray cooling system. In short, the above disclosed features can be combined in a wide variety of configurations within the anticipated scope of the invention.

Furthermore, it is to be understood that cooled components, cooled singly or in groups as described above, can be mounted on circuit boards to form systems including one or more circuit boards carrying one or more cooled components that are electronically interlinked via the circuit boards. Such systems are also within the scope of the invention. Additionally, groups of the cooled components combined with one or more cooling fluid condensers that cool fluid from numerous cooled components are also within the scope of the invention.

While particular forms of the invention have been illustrated and described, it will be apparent that various modifications can be made without departing from the spirit and scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

What is claimed is:

1. A system for cooling a component with a liquid cooling fluid, comprising:
a first cooling subsystem configured to cool the component with the liquid cooling fluid;
a second cooling subsystem configured to cool the component using a phase change of the liquid cooling fluid, wherein the second cooling subsystem is separately operable from the first cooling subsystem, and wherein the same cooling fluid is used by the first and second cooling subsystems.

2. A system for cooling a component with a cooling fluid, comprising:
a first cooling subsystem configured to cool the component; and
a second cooling subsystem configured to cool the component using a phase change of the cooling fluid, wherein the second cooling subsystem is separately operable from the first cooling subsystem;
wherein the first cooling subsystem operates passively.

3. The system of claim 2, wherein the first cooling subsystem is a thermosyphon.

4. The system of claim 3, and further comprising a valve that limits the operation of the thermosyphon.

5. The system of claim 2, wherein:
the first cooling subsystem is a thermosyphon; and
the second cooling subsystem is configured to spray-cool the component.

6. The system of claim 1, wherein:
the first cooling subsystem defines a first-subsystem pathway in which the cooling fluid circulates;
the second cooling subsystem defines a second-subsystem pathway in which the cooling fluid circulates; and
the first-subsystem pathway and the second-subsystem pathway are at least partially distinct.

7. The system of claim 1, wherein the second cooling subsystem is configured to cool the component at a heat flux substantially greater than the heat flux with which the first cooling subsystem is capable of cooling the component.

8. A system for cooling a component with a liquid cooling fluid, comprising:
a first cooling subsystem configured to cool the component; and
a second cooling subsystem configured to cool the component using a phase change of the liquid cooling fluid, wherein the second cooling subsystem is separately operable from the first cooling subsystem;
wherein the cooling system is a closed loop system incorporated in a cooling cap that can be adjoined to the component.

9. A system for cooling a component with a liquid cooling fluid, comprising:
a first cooling subsystem configured to cool the component; and
a second cooling subsystem configured to cool the component using a phase change of the liquid cooling fluid, wherein the second cooling subsystem is separately operable from the first cooling subsystem;
wherein the cooling system is incorporated in a cooling cap configured to form a closed loop system when affixed to a substrate mounting the component.

10. A system for cooling a component with a liquid cooling fluid, comprising:
a first cooling subsystem configured to cool the component;
a second cooling subsystem configured to cool the component using a phase change of the liquid cooling fluid, wherein the second cooling subsystem is separately operable from the first cooling subsystem; and
a controller configured to selectively operate the second cooling subsystem based on cooling requirements of the component.

11. The system of claim 10, wherein the controller is further configured to selectively operate the first cooling subsystem based on the cooling requirements of the component.

12. The system of claim 10, wherein the second cooling subsystem is a spray-cooling system.

13. The system of claim 12, wherein the controller is configured to control the flux of coolant sprayed by the spray-cooling system.

14. The system of claim 10, wherein the component is configured to run in a plurality of performance states including a low-heat-flux state and a high-heat-flux state.

15. The system of claim 14, wherein the controller is configured to operate the second cooling system when the component is operating in the high-heat-flux state.

16. The system of claim 14, wherein the controller is configured to control the performance state of the component.

17. The system of claim 16, wherein the controller is configured to control the performance state of the component based on the functionality of the second cooling system.

18. The system of claim 16, wherein the controller is configured to control the performance state of the component based on parameters received from sources external to the component and cooling system.

19. The system of claim 10, wherein:
the first cooling subsystem uses a phase change of the liquid cooling fluid to cool a component;
the controller is configured to receive component dry-out information; and
the controller determines the cooling requirements of the component based on the received component dry-out information.

20. The system of claim 19, and further comprising a temperature sensor configured to sense the temperature of the component;
wherein the controller is configured to receive the component dry-out information from the temperature sensor.

21. The system of claim 19, and further comprising a temperature sensor configured to sense the temperature of gaseous cooling fluid;
wherein the controller is configured to receive the component dry-out information from the temperature sensor.

22. The system of claim 19, and further comprising a pressure sensor configured to sense the pressure of gaseous cooling fluid;
wherein the controller is configured to receive the component dry-out information from the pressure sensor.

23. The system of claim 19, wherein the component dry-out information identifies the performance state of the component.

24. The system of claim 19, wherein the component dry-out information identifies the power usage of the component.

25. The system of claim 10, wherein the controller is further configured to selectively operate the second cooling subsystem over thermally distinct portions of the component based on their individual cooling requirements.

26. A system for cooling a component with a liquid cooling fluid, comprising:
 a first cooling subsystem configured to cool the component;
 a second cooling subsystem configured to cool the component using a phase change of the liquid cooling fluid, wherein the second cooling subsystem is separately operable from the first cooling subsystem; and
 a controller configured to control the performance state of the component.

27. The system of claim 26, wherein the controller controls the performance state of the component based on cooling system functionality information.

28. The system of claim 26, wherein the controller controls the performance state of the component based on parameters regarding conditions external to the component and cooling system.

* * * * *